United States Patent
Bacon

(10) Patent No.: US 9,564,887 B2
(45) Date of Patent: Feb. 7, 2017

(54) HIGH FREQUENCY ABSORPTIVE SWITCH ARCHITECTURE

(71) Applicant: Peregrine Semiconductor Corporation, San Diego, CA (US)

(72) Inventor: Peter Bacon, Derry, NH (US)

(73) Assignee: Peregrine Semiconductor Corporation, San Diego, CA (US)

( * ) Notice: Subject to any disclaimer, the term of this patent is extended or adjusted under 35 U.S.C. 154(b) by 131 days.

(21) Appl. No.: 14/527,168

(22) Filed: Oct. 29, 2014

(65) Prior Publication Data

US 2016/0126943 A1 May 5, 2016

(51) Int. Cl.
H03K 17/687 (2006.01)
H03K 17/16 (2006.01)
H03K 17/693 (2006.01)

(52) U.S. Cl.
CPC .......... H03K 17/162 (2013.01); H03K 17/693 (2013.01)

(58) Field of Classification Search
USPC ........................................................ 327/427
See application file for complete search history.

(56) References Cited

U.S. PATENT DOCUMENTS

| 5,180,998 A | * | 1/1993 | Willems | H03H 11/20 327/237 |
| 5,774,792 A | * | 6/1998 | Tanaka | H03K 17/693 333/103 |
| 7,626,443 B2 | * | 12/2009 | Kitazawa | H03K 17/693 327/416 |
| 7,910,993 B2 | | 3/2011 | Brindle et al. | |
| 2006/0035614 A1 | * | 2/2006 | Inui | H03K 17/002 455/307 |

* cited by examiner

*Primary Examiner* — Lincoln Donovan
*Assistant Examiner* — Patrick Chen
(74) *Attorney, Agent, or Firm* — Jaquez Land Greenhaus LLP; Martin J. Jaquez, Esq.; John Land, Esq.

(57) ABSTRACT

An absorptive switch architecture suitable for use in high frequency RF applications. A switching circuit includes a common terminal and one or more ports, any of which may be selectively coupled to the common terminal by closing an associated path switch; non-selected, unused ports are isolated from the common terminal by opening an associated path switch. Between each path switch and a port are associated shunt switches for selectively coupling an associated signal path to circuit ground. Between each path switch and a port is an associated absorptive switch module. Each absorptive switch module includes a resistor coupled in parallel with a switch. The combination of the resistor and the switch of the absorptive switch module is placed in series with a corresponding signal path from each port to the common terminal, rather than in a shunt configuration.

10 Claims, 7 Drawing Sheets

410

HIGH FREQUENCY ABSORPTIVE SWITCH ARCHITECTURE

BACKGROUND

(1) Technical Field

This invention generally relates to electronic signal switching devices, and more specifically to electronic signal switching devices having high frequency absorptive switch architectures.

(2) Background

Electronic signal switches are used in a wide variety of applications. One type of signal switch in common use is a field effect transistor (FET) that is actively controlled through a gate terminal to block or pass an electrical signal connected in series with the source and drain terminals of the FET. In many applications, the presence of a FET switch has a negligible effect on signals blocked or passed by the switch. However, in radio frequency (RF) circuits, the presence of a FET switch may have significant effects on the rest of the circuit, particularly with respect to termination impedance and isolation levels. Such effects arise because an "ON" (low impedance) FET has a non-zero resistance, and an "OFF" (high impedance) FET behaves as a capacitor.

For example, switch architectures for RF circuits typically have used one or more shunt termination FET switches in series with a fixed termination resistance to form a termination path to circuit ground for unused ports. In most cases, because of the imperfect switching characteristics of a shunt FET switch, an additional FET switch is needed to achieve high isolation of the termination path from the rest of the "OFF path" when the shunt FET is configured as a short to circuit ground.

FIG. 1A is a block diagram of an RF circuit 100 having a shunt switch architecture in accordance with the prior art. All of the switches in the RF circuit 100 may be implemented as FET switches, as described below in further detail. A common RF terminal $RF_C$ may be selectively coupled to any of two or more RF pathways corresponding to RF terminals $RF_1$-$RF_N$. For example, each of the RF terminals $RF_1$-$RF_N$ may be coupled to respective radio antennas while $RF_C$ is coupled to radio transceiver circuitry, such as in a cellular phone. In the illustrated example, to couple terminal $RF_1$ to $RF_C$, a series-coupled $RF_1$ path switch 102 and an isolation switch 104 are set to "ON" (low impedance) to pass signals between $RF_1$ and $RF_C$. Concurrently, one or more associated shunt switches 106 coupled from circuit ground to a signal path 105 between the $RF_1$ path switch 102 and the isolation switch 104 are set to "OFF" (high impedance). In addition, a termination switch 108 connected from circuit ground through a series termination resistor $R_{Term1}$ to terminal $RF_1$ is also set to "OFF".

When terminal $RF_1$ is coupled to $RF_C$ as described above, signals pass between $RF_1$ and $RF_C$ through the resistance provided by the $RF_1$ path switch 102 and the isolation switch 104, and neither signal path 105 nor $RF_1$ are coupled to circuit ground through the shunt switches 106 or the termination switch 108, respectively. In order to isolate $RF_C$ from the other terminals $RF_2$-$RF_N$ (all of which have signal paths similar to the $RF_1$ signal path), the other RF pathways are set to be effectively isolated from $RF_C$. When another RF terminal is to be coupled to $RF_C$, then the $RF_1$ signal path must be similarly effectively isolated from $RF_C$. This is accomplished by setting $RF_1$ path switch 102 to "OFF" (high impedance). However, various types of switches—including FET switches—exhibit current leakage when nominally "OFF". In such embodiments, the shunt switches 106 are provided. Thus, when the $RF_1$ circuit path is to be isolated, the corresponding shunt switches 106 are set to "ON" (low impedance) in order to shunt leakage current through the $RF_1$ path switch 102 to ground.

In order to provide a fixed termination impedance when $RF_1$ is "OFF", the termination switch 108 is set to "ON" (low impedance) in order to couple $RF_1$ though $R_{Term1}$ to circuit ground. The value of $R_{Term1}$ is application dependent, but is generally set such that, taking into account the "ON" resistance ($R_{on}$) of the termination switch 108 itself, the characteristic impedance at $RF_1$ is about 50 ohms for most RF applications. Without such termination, a nominally "OFF" antenna may reflect received power back into the RF circuit 100 and cause signal interference with other RF circuitry, such as another antenna that is "ON".

In order to achieve high isolation from $RF_1$ to $RF_C$, and to raise the level of impedance that is effectively in parallel with $R_{Term1}$ and termination switch 108, the isolation switch 104 is set to "OFF" (high impedance). In a typical application, the "OFF" resistance of the isolation switch 104 is set at thousands of ohms in order to achieve 20-30 dB of isolation.

As noted above, all of the switches in the RF circuit 100 of FIG. 1A may be implemented as FET switches. FIG. 1B is a schematic diagram of a typical switch configuration 120 suitable for use in the circuit shown in FIG. 1A. Shown are one or more FETs series stacked (for voltage handling) in a conventional configuration. A drain D to source S resistance R of high value ensures that each switch provides uniform resistance when the FETs are set to "OFF" (high impedance) under the control of a signal to the gate structures G; the value of R is application dependent. When the FETs are set to "ON" (low impedance) under the control of a signal to the gate structures G, the resistance $R_{on}$ from the drain D and source S is quite low but not zero.

A problem with the shunt switch architecture shown in FIG. 1A is that, as the frequency of operation of the RF circuit 100 increases, the combined parasitic FET capacitance of the isolation switch 104 and termination switch 108 respectively begin to degrade both the isolation level and the termination impedance of the RF circuit 100 as a whole. To counter this behavior, the FET termination switch 108 is often made smaller to minimize its capacitance. This in turn means that more of the RF power from the nominally isolated $RF_1$-$RF_N$ terminals is terminated in the corresponding termination switches 108 rather than in the corresponding termination resistors $R_{Term1}$-$R_{TermN}$ because of the higher resistance of the smaller FET switch devices. Terminating such power in the smaller FET switches can lead to premature failure; to avoid that issue, the power handling capability for the RF circuit 100 would have to be specified at a reduced level, which may be commercially disadvantageous.

Accordingly, there is a need for a switch architecture suitable for use with high frequency RF signals that does not exhibit the problems of the prior art. The present invention meets this need.

SUMMARY OF THE INVENTION

Aspects of the invention include an absorptive switch architecture suitable for use in high frequency RF applications. A switching circuit includes a common terminal $RF_C$ and one or more ports $RF_1$-$RF_N$, any of which may be selectively coupled to the common terminal $RF_C$ by closing an associated path switch; non-selected, unused ports are isolated from the common terminal $RF_C$ by opening an associated path switch. Between each path switch and a port $RF_1$-$RF_N$ are associated shunt switches for selectively coupling an associated signal path to circuit ground.

Between each path switch and a port $RF_1$-$RF_N$ is an associated absorptive switch module. Each absorptive switch module includes a resistor $R_{Term}$ coupled in parallel with a switch. Accordingly, the combination of the resistor $R_{Term}$ and the switch of the absorptive switch module is placed in series with a corresponding signal path from each RF input port to the common terminal $RF_C$, rather than in a shunt configuration.

In operation, when $RF_C$ is to be coupled to (for example) terminal $RF_1$ (i.e., an "ON" state), the $RF_1$ path switch is set to "ON" (low impedance) and the associated shunt switches are set to "OFF". In addition, the switch of the absorptive switch module is set to "ON", allowing signal transmission between $RF_C$ and $RF_1$. In this mode of operation, the parallel combination of the switch resistance $R_{on}$ and the resistor $R_{Term}$ looks like two resistors in parallel: $R_{on} \| R_{Term}$. For RF applications, since insertion loss is critical, $R_{on}$ is set to be much less than the system characteristic impedance.

In the converse state, when terminal $RF_1$ is to be isolated from $RF_C$ (i.e., an "OFF" state), the $RF_1$ path switch is set to "OFF" (high impedance) and the associated shunt switches are set to "ON". In addition, the switch of the absorptive switch module is set to "OFF". In this mode of operation, the switch has the characteristics of a capacitor (with value $C_{off}$) rather than a resistor (with value $R_{on}$). Thus, the parallel combination of the switch capacitance $C_{off}$ and the resistor $R_{Term}$ looks like a parallel RC circuit: $C_{off} \| R_{Term}$. Notably, the associated shunt switches are partially repurposed to shunt any RF signal present on the $RF_1$ terminal to ground through the absorptive switch module.

There are at least four benefits to the absorptive switch architecture described above over traditional circuit configurations:

First, a second isolating device is no longer needed to isolate an $RF_N$ terminal from the rest of the "OFF" path to $RF_C$. Accordingly, the number of distinct switch elements is reduced from two to one.

Second, the parallel combination of the termination resistor $R_{Term}$ and the resistance $R_{on}$ of the switch begins to look more capacitive as frequency is increased. This is a beneficial behavior because the impedance to circuit ground of the shunt switches begins to look more inductive as frequency is increased. These two reactive impedances, when added in series, substantially cancel each other and the result remains more nearly a real impedance close to a targeted characteristic impedance.

Third, terminated RF power can be more consistently and completely terminated in the $R_{Term}$ resistor and not in the switch of the absorptive switch module, and power is also dissipated across the parallel shunt switches connected in series with the absorptive switch module.

Fourth, the parallel combination of the $R_{Term}$ termination resistor and the switch is very modular in nature, particularly when the switch is implemented as a FET.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figures 1A, 1B:
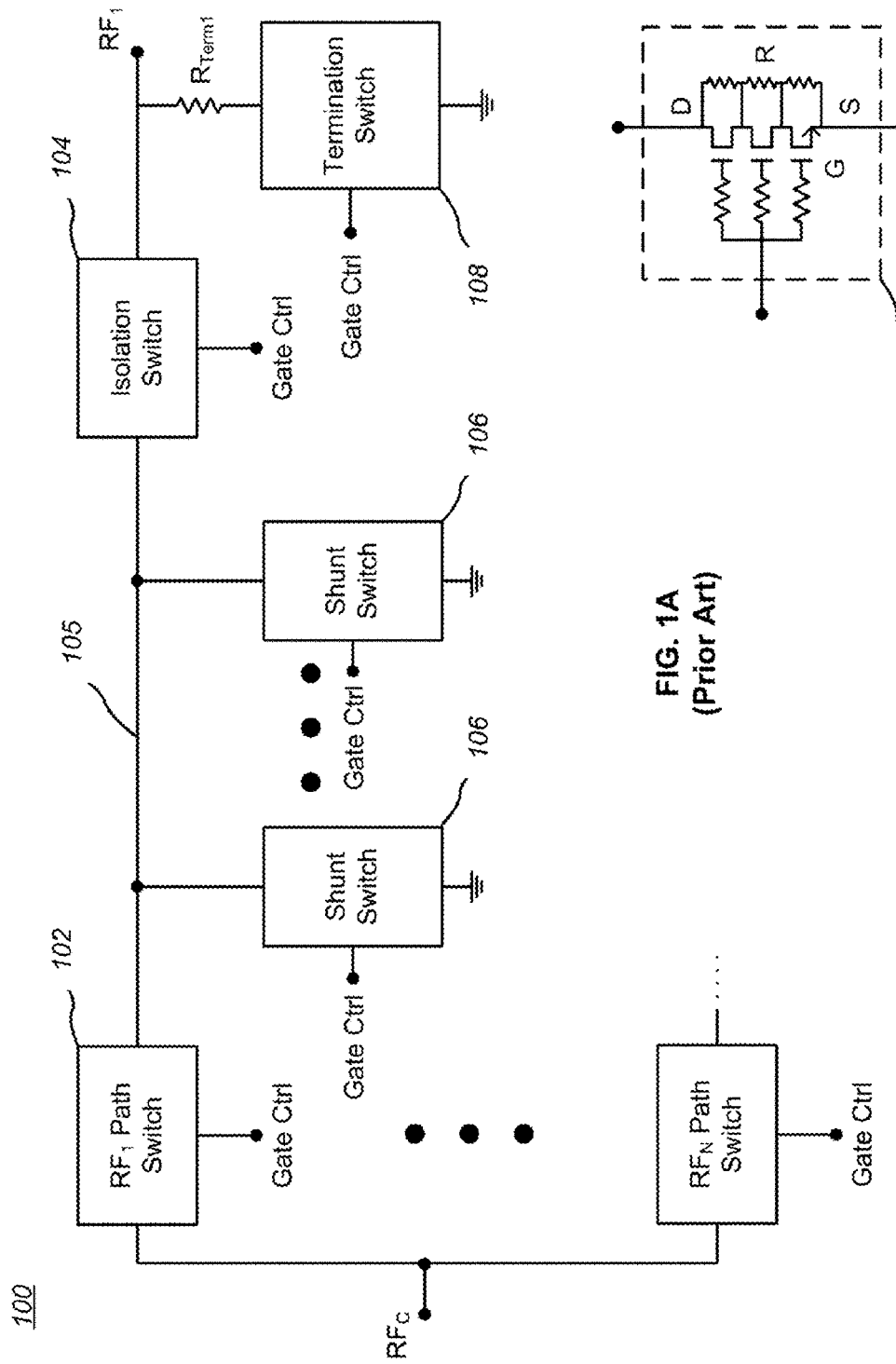
FIG. 1A is a block diagram of an RF circuit having a shunt switch architecture in accordance with the prior art.
FIG. 1B is a schematic diagram of a typical switch configuration suitable for use in the circuit shown in FIG. 1A.
Figures 2A, 2B:
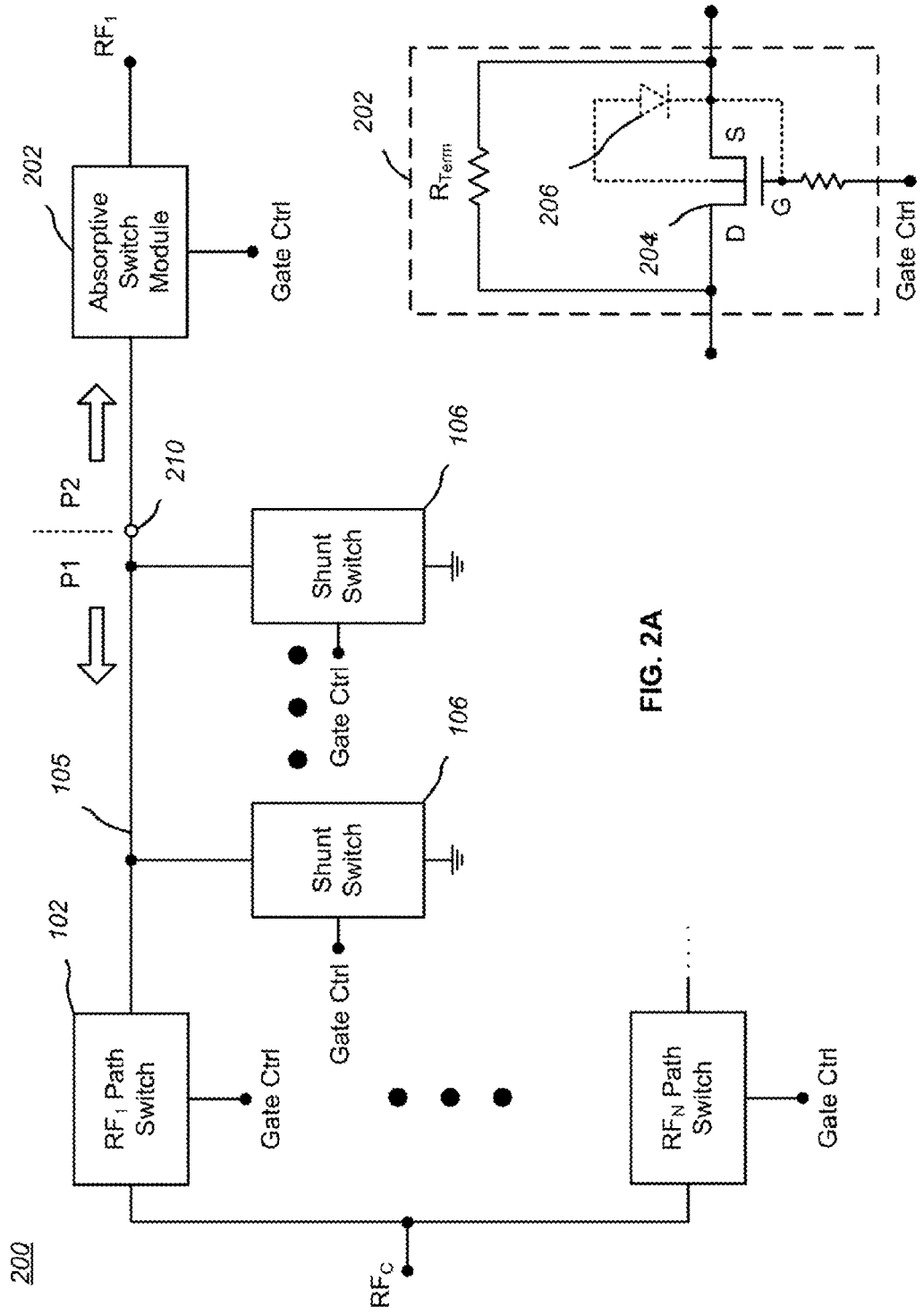
FIG. 2A is a block diagram of an RF circuit having an absorptive switch architecture suitable for use in high frequency RF applications.
FIG. 2B is a schematic diagram of one absorptive switch module configuration suitable for use in the circuit shown in FIG. 2A.

FIG. 2A is a block diagram of an RF circuit 200 having an absorptive switch architecture suitable for use in high frequency RF applications. While similar in some aspects to the circuit shown in FIG. 1A, a critical distinction is that the isolation switch 104 and termination switch 108 of FIG. 1A have been replaced entirely by an absorptive switch module 202.

FIG. 2B is a schematic diagram of one absorptive switch module 202 configuration suitable for use in the circuit shown in FIG. 2A. As illustrated, the absorptive switch module 202 includes a resistor $R_{Term}$ coupled in parallel with a switch 204, shown in the illustrated embodiment as a FET switch; however, other switching devices may be used for the switch 204, such as switches implemented as microelectromechanical systems (MEMS), since nearly every practical switching component exhibits some level of "OFF" capacitance. While only one switch 204 is shown, one or more series stacked switches may be used for handling applied voltages, in known fashion.

For most uses, particularly RF applications, the characteristic impedance of $R_{Term}$ may be set to about 50 ohms; however, the concepts described in this document work for a broad range of characteristic impedances. The parallel combination of the resistor $R_{Term}$ and the switch 204 of the absorptive switch module 202 is placed in series with the signal path from each RF input to $RF_C$, rather than in a shunt configuration.

In operation, when $RF_C$ is to be coupled to terminal $RF_1$ (i.e., an "ON" state), the $RF_1$ path switch 102 is set to "ON" (low impedance) and the associated shunt switches 106 are set to "OFF". In addition, the switch 204 of the absorptive switch module 202 is set to "ON", allowing signal transmission between $RF_C$ and $RF_1$. In this mode of operation, the parallel combination of the switch 204 resistance $R_{on}$ and the resistor $R_{Term}$ looks like two resistors in parallel: $R_{on}\|R_{Term}$. For RF applications, since insertion loss is critical, $R_{on}$ is set to be much less than the system characteristic impedance (which is 50 ohms for all examples here; in other applications, a different system characteristic impedance may be used). For example, $R_{on}$ may be set to be on the order of a few ohms for many RF applications. Therefore, the parallel combination $R_{on}\|R_{Term}$ looks like a resistance close to $R_{on}$ over a broad frequency range.

In the converse state, when terminal $RF_1$ is to be isolated from $RF_C$ (i.e., an "OFF" state), the $RF_1$ path switch 102 is set to "OFF" (high impedance) and the associated shunt switches 106 are set to "ON". In addition, the switch 204 of the absorptive switch module 202 is set to "OFF". In this mode of operation, the switch 204 has the characteristics of a capacitor (with value $C_{off}$) rather than a resistor (with value $R_{on}$). Thus, the parallel combination of the switch 204 capacitance $C_{off}$ and the resistor $R_{Term}$ looks like a parallel RC circuit: $C_{off}\|R_{Term}$. In a typical FET implementation of the switch 204 for RF applications, $C_{off}$ would be on the order of femtofarads. For example, assuming a FET process figure of merit $R_{on}*C_{off}$ of 200 fs, if $R_{on}$ is set to about 3 ohms, then $C_{off}$ is about 67 femtofarads.

Notably, the associated shunt switches 106 are partially repurposed to shunt any RF signal present on the $RF_1$ terminal to ground through the absorptive switch module 202.

While FIG. 2A shows multiple path switches $RF_1$-$RF_N$, each of which may have a corresponding absorptive switch module 202, other embodiments may include a single path switch, such as in a single-pole, single-throw (SPST) high isolation switch application. In an SPST embodiment, an absorptive switch module 202 may be coupled to either or both terminals of the switch. Further, in general, an absorptive switch module 202 may be coupled to any port or element where termination would be useful, but need not be coupled to every port. Thus, in some embodiments, one or more ports may be coupled to an absorptive switch module 202, while other ports may be coupled to a conventional termination circuit and/or be unterminated (i.e., reflective).

Figure 3A:
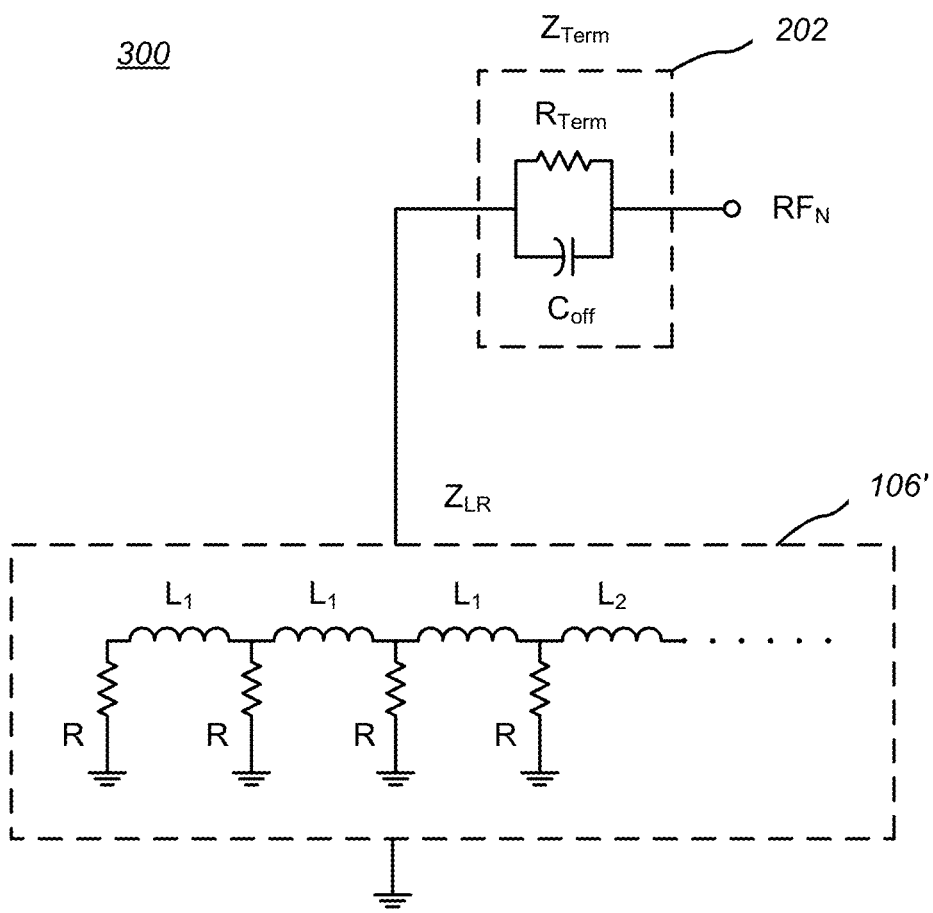
FIG. 3A is a schematic diagram of an impedance circuit model corresponding to the absorptive switch module and the shunt switches shown in FIG. 2A.

To better understand the benefits of the absorptive switch architecture, FIG. 3A is a schematic diagram of an impedance circuit model 300 corresponding to the absorptive switch module 202 and the associated shunt switches 106 shown in FIG. 2A. The associated shunt switches 106 are essentially the components on the "P1" side of node 210 in FIG. 2A (ignoring the RF path switch 102, which is in an "OFF" or high impedance state for purposes of this example). The switch 204 and the resistor $R_{Term}$ of the absorptive switch module 202 are the components on the "P2" side of node 210 in FIG. 2A.

The components of the absorptive switch module 202 when in the "OFF" (high impedance) state have an impedance $Z_{Term}=(Ra, -jXa)$, where "Ra" is essentially the resistance of an instance of the resistor $R_{Term}$ and "Xa" is essentially the capacitive reactance of an instance of the switch 204 in the "OFF" state (typically there are parasitic resistances and capacitances that modify these levels slightly). When "ON" (low impedance), the parallel shunt switches 106 essentially form a distributed inductance-resistance (LR) network 106', as shown in FIG. 3A. That is, each shunt switch 106 may be modeled has having a resistance R and an inductance $L_1$; in addition, other component or parasitic inductances $L_2$ may be present in particular embodiments. The components of the associated shunt switches 106' have an impedance $Z_{LR}=(Rb, +jXb)$, where "Rb" is the effective resistance of the combined associated shunt switches 106 and "Xb" is the inductive reactance of the combined structure of the distributed interconnect between the shunt switches 106' and ground inductance associated with the shunt switches 106' in the "ON" state.

Figure 3B:
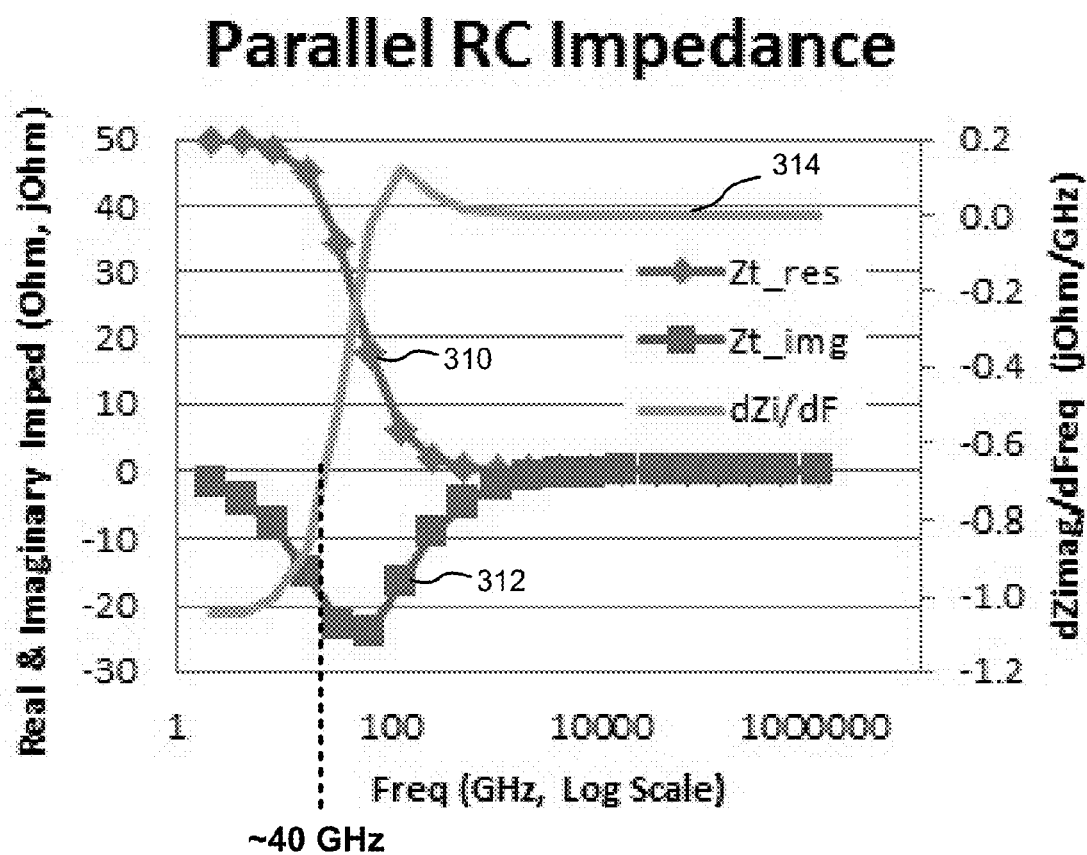
FIG. 3B is graph of the real and imaginary impedances for the impedance circuit model shown in FIG. 3A, and of the corresponding ratio of derivative values, dZimag/dFreq.

For the circuit model 300 as shown, the total impedance looking into the $RF_N$ port connected to the serially-connected absorptive switch module 202 and the distributed shunt switch LR network 106' is given by $Z_{in}=Z_{Term}+Z_{LR}$; accordingly, $Z_{in}=(Ra, -jXa)+(Rb, +jXb)$, which may be rearranged as $Z_{in}=((Ra+Rb), j(Xb-Xa))$. Thus, the negative capacitive reactance of each switch 204 behaves as a negative inductance that substantially offsets the positive inductive reactance of the associated shunt switches 106; this holds valid over a wide range of frequencies (e.g., about 1-40 GHz), until the capacitive impedance of the switch 204 becomes comparable in magnitude to $R_{Term}$. More particularly, the useful range of frequencies is in the region where the derivative of the imaginary component of the inductance, dZimag, divided by the derivative of the frequency, dFreq, is negative. This can be seen in FIG. 3B, which is a graph of the real impedance 310 (also labeled Zt_res) and the imaginary impedance 312 (also labeled Zt_img) for the absorptive switch module (202) shown in FIG. 3A, and of the corresponding ratio of derivative values 314, dZimag/dFreq (also labeled dZi/dF); in the illustrated graph, dZimag/dFreq 314 is negative below about 100 GHz, and is particularly useful when below the indicated 40 GHz dotted line, where the slope approaches about -1 jOhm/GHz.

For many RF applications, $Z_{in}$ is ideally equal to (50, +j0) ohms (i.e., essentially purely resistive). In terms of design considerations for such RF applications, the values selected for all of the components (taking into account parasitic RLC values) should be such that (Ra+Rb) is closer to 50 ohms than just Ra alone, and such that j(Xb−Xa) is closer to J0 than just −jXa alone.

Figure 4A:
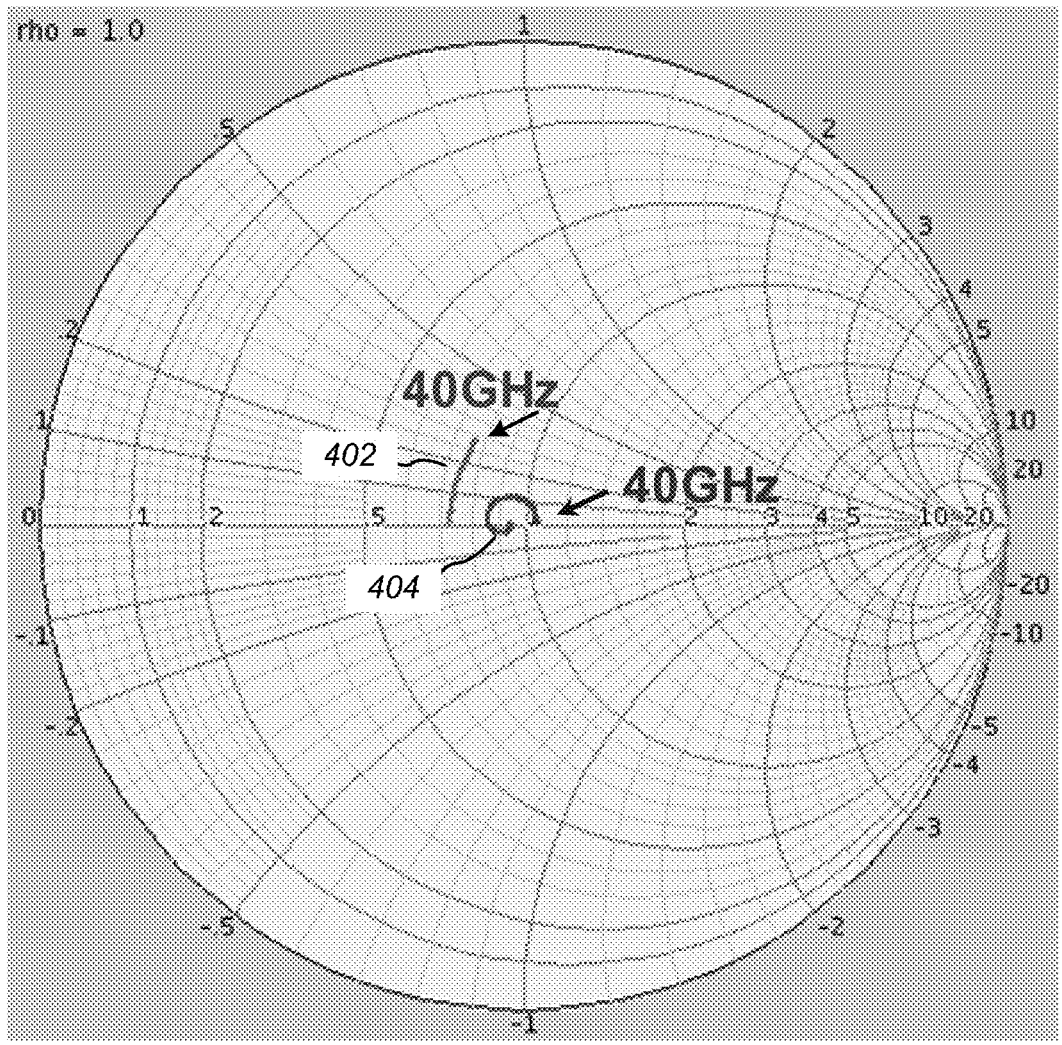
FIG. 4A is a Smith chart comparing the inductive termination impedance (increasing with frequency) of the prior art termination switch (108) plus termination resistor $R_{Term1}$ of FIG. 1A against the combined (capacitive and inductive) termination impedance of a model circuit of the type shown by block 202 in FIG. 3A, as seen at the "OFF" $RF_N$ port.

It should be appreciated that the disclosed absorptive switch architecture leverages the inherently capacitive nature of the parallel "OFF" switch 204 of FIG. 2B to provide a termination impedance that is capacitive at higher frequencies and which accordingly substantially offsets the inductive impedance behavior of the shunt switches 106' at higher frequencies. This is in stark contrast to conventional designs which provide a termination impedance that is always inductive at higher frequencies. For example, FIG. 4A is a Smith chart 400 comparing the inductive termination impedance 402 (increasing with frequency) of the prior art termination switch 108 plus termination resistor $R_{Term1}$ of FIG. 1A against the combined (capacitive and inductive) termination impedance 404 of a model circuit of the type shown by block 202 in FIG. 3A and described above, as seen at the "OFF" $RF_N$ port. The frequency range for this example is about 1-40 GHz.

Figure 4B:
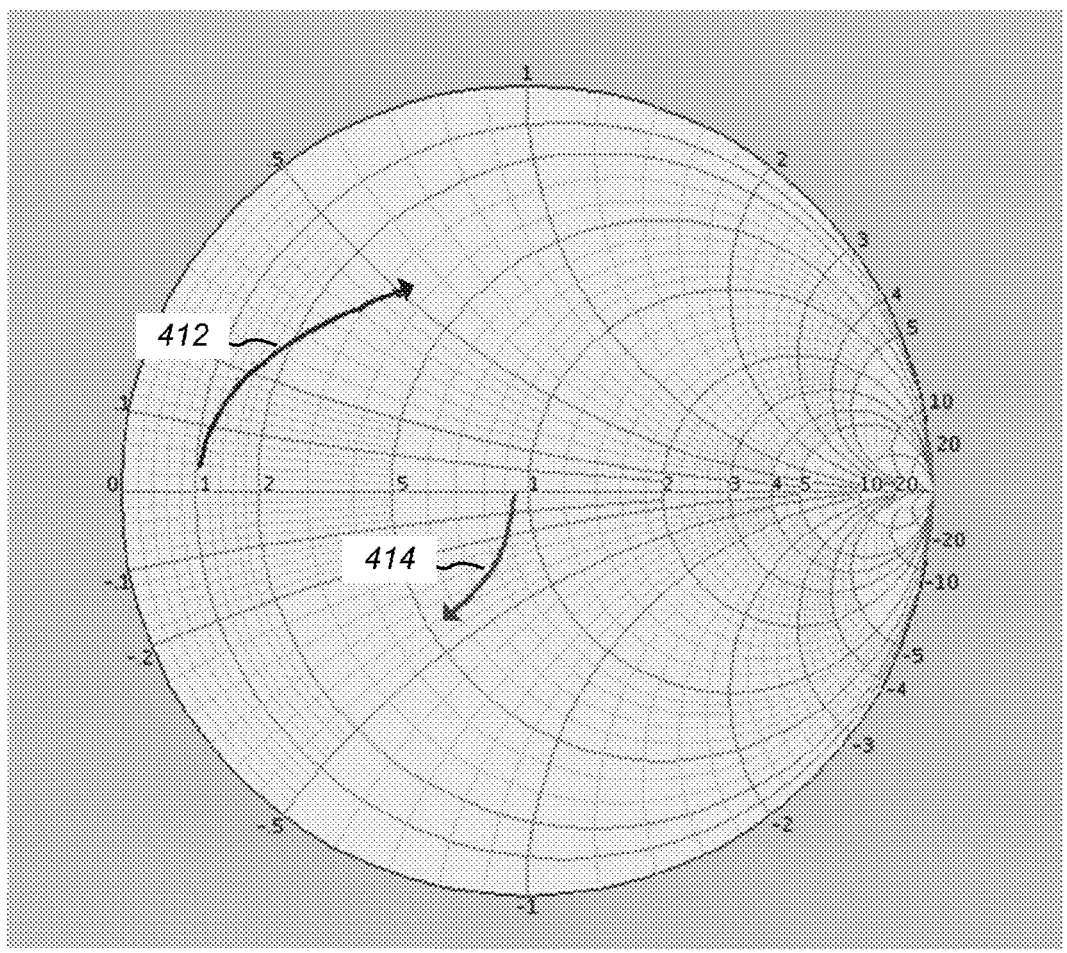
FIG. 4B is a Smith chart separately showing the inductive impedance behavior of the shunt switches (106') and the capacitive impedance behavior of the absorptive switch module (202), both of FIG. 3A.

FIG. 4B is a Smith chart 410 separately showing the inductive impedance behavior of the shunt switches 106' (curve 412) and the capacitive impedance behavior of the absorptive switch module 202 (curve 414), both of FIG. 3A; the respective arrows of the curves 412, 414 indicate offsetting changes in impedance as frequency increases. The frequency range for this example is about 1-40 GHz.

Accordingly, the capacitive behavior of the parallel "OFF" switch 204 of the absorptive switch module 202 can be balanced against the distributed inductive behavior of the "ON" parallel shunt switches 106 so as to provide a near ideal terminated port impedance of 50 ohms for RF applications (of course, other impedance levels may be selected for particular applications by changing component values). This results in a very good voltage standing wave ratio (VSWR) versus frequency, as illustrated for a particular model implementation of the absorptive switch architecture in FIG. 5A and FIG. 5B.

Figure 5A:
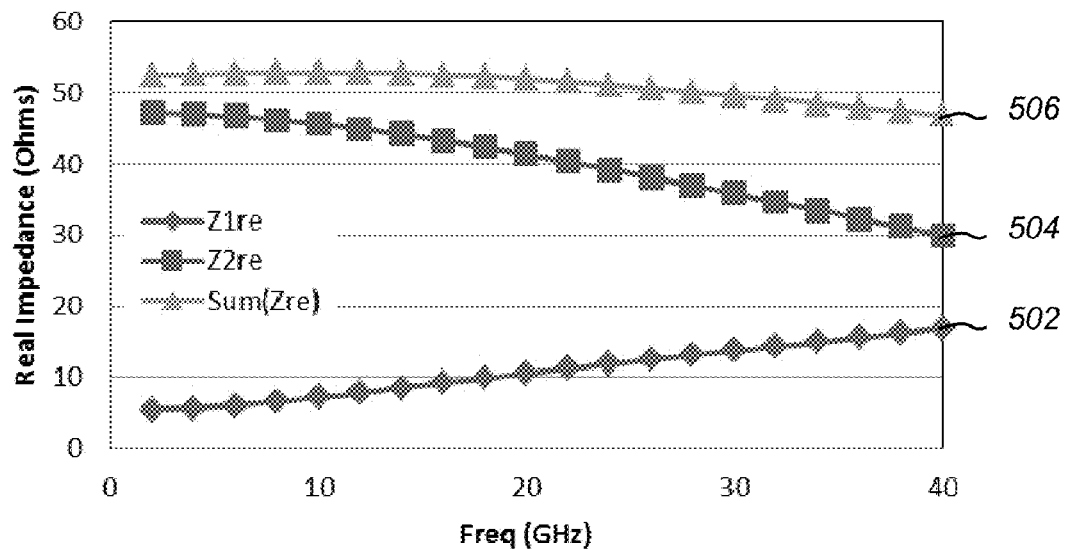
FIG. 5A is a graph of real impedance (resistance) versus frequency for the absorptive switch module and the associated shunt switches of one embodiment of the absorptive switch architecture, and their summation.

FIG. 5A is a graph of real impedance (resistance) versus frequency for the absorptive switch module 202 and the associated shunt switches 106 of one embodiment of the absorptive switch architecture, and their summation. Graph line 502 represents the frequency dependent real impedance Z1re of the active components on the "P1" side of node 210 in FIG. 2A (i.e., the associated shunt switches 106). As illustrated, Z1re increases with frequency. Graph line 504 represents the frequency dependent real impedance Z2re of the components on the "P2" side of node 210 in FIG. 2A (i.e., the absorptive switch module 202). As illustrated, Z2re decreases with frequency. Graph line 506 represents the sum Zre of Z1re and Z2re. As can be seen, the total real impedance Zre is near 50 ohms over a wide frequency range, since much of the frequency-dependent changes to the two constituent real impedances Z1re and Z2re substantially offset each other.

Figure 5B:
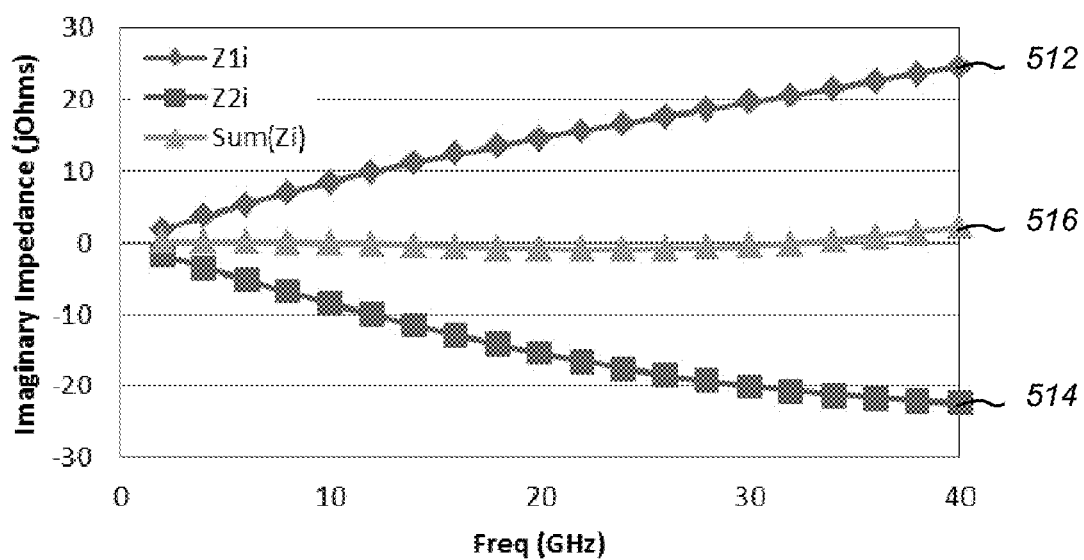
FIG. 5B is a graph of imaginary impedance (reactance) versus frequency for the absorptive switch module and the associated shunt switches of one embodiment of the absorptive switch architecture, and their summation.

FIG. 5B is a graph of imaginary impedance (reactance) versus frequency for the absorptive switch module 202 and the associated shunt switches 106 of one embodiment of the absorptive switch architecture, and their summation. Graph line 512 represents the frequency dependent imaginary impedance Z1i of the active components on the "P1" side of node 210 in FIG. 2A (i.e., the associated shunt switches 106). As illustrated, Z1i is positive and its absolute magnitude increases with frequency (i.e., the impedance becomes increasingly more positive, and thus more inductive). Graph line 514 represents the frequency dependent imaginary impedance Z2i of the components on the "P2" side of node 210 in FIG. 2A (i.e., the absorptive switch module 202). As illustrated, Z2i is negative and its absolute magnitude increases with frequency (i.e., the impedance becomes increasingly more negative, and thus more capacitive). Graph line 516 represents the sum Zi of Z1i and Z2i. As can be seen, the total imaginary impedance Zi is near zero ohms over a wide frequency range, since much of the frequency-dependent changes to the two constituent imaginary impedances Z1i and Z2i substantially offset each other.

There are at least four benefits to the absorptive switch architecture described above over traditional circuit configurations:

First, a second isolating device (i.e., isolation switch 104) is no longer needed to isolate an $RF_N$ terminal from the rest of the "OFF" path to $RF_C$. Instead, the disclosed architecture utilizes the "ON" (low impedance) path to circuit ground of the partially repurposed associated shunt switches 106 as the RF ground for the $RF_N$ termination impedance. Accordingly, the number of distinct switch elements is reduced from two (isolation switch 104 and termination switch 108) to one (the switch 204 in the absorptive switch module 202).

Second, the parallel combination of the termination resistor $R_{Term}$ and the resistance $R_{on}$ of the switch 204 begins to look more capacitive as frequency is increased. This is a beneficial behavior because the impedance to circuit ground of the shunt switches 106 begins to look more inductive as frequency is increased. These two reactive impedances, when added in series, substantially cancel each other and the result remains more nearly a real impedance close to the targeted characteristic impedance, as shown in FIG. 5A and FIG. 5B. This results in excellent isolation, generally exceeding −28 dB at 40 GHz and reaching in excess of −35 dB at 40 GHz for one model circuit. The insertion loss of the isolation mode of several modeled circuits was less than −4 dB from about 1-40 GHz. The return loss of one modeled circuit exceeded −22 dB from about 1-40 GHz and reached in excess of −30 dB at certain frequencies. In one modeled circuit, the absorptive switch architecture had a return loss significantly better than a comparable circuit implemented with a conventional termination architecture.

Third, terminated RF power can be more consistently and completely terminated in the $R_{Term}$ resistor and not in the switch 204 of the absorptive switch module 202 (see FIG. 2B). The $R_{Term}$ resistor can be sized to the required power level, and the parallel switch 204 can be "stacked" to achieve the associated voltage handling capability. Modeling example embodiments of the absorptive switch architecture shows that 60% to 90% of incident power is dissipated by the $R_{Term}$ resistor from about 1-40 GHZ (the percentage varies with frequency), with the balance dissipated through the parallel shunt switches 106.

Fourth, the parallel combination of the $R_{Term}$ termination resistor and the switch 204 is very modular and compact in nature, particularly when the switch 204 is implemented as a FET. This makes the use of the absorptive switch module 202 and variants of that module very straightforward. For example, multiple absorptive switch modules 202 can be series connected to handle higher power, and the compact size of such modules provides flexibility in their placement within integrated circuit layouts. Further, because of the distributed nature of the shunt switches 106 (see FIG. 2A), absorptive switch modules 202 can be readily added, allowing changing a circuit design from a reflective switch to a terminated switch very easily. In addition, each absorptive switch module 202 requires only a single high impedance gate drive connection for control.

Referring back to FIG. 2B, also shown is an optional body diode 206 coupled between the body of the FET switch 204 and the source S. A body diode 206 may be useful in some implementations to reduce accumulated charge, in accordance with the teachings of U.S. Pat. No. 7,910,993, entitled "Method and Apparatus for Use in Improving Linearity of MOSFETS Using an Accumulated Charge Sink", issued on Mar. 22, 2011 and assigned to the assignee of the present invention, the contents of which are hereby incorporated by reference.

Another aspect of the invention includes a method for terminating one or more unused ports of a switching circuit, including coupling at least one unused port to an absorptive switch module. In some embodiments, the absorptive switch module includes a switch and a resistor coupled in parallel, wherein the switch has the characteristics of a resistor in a first (closed) state and of a capacitor in a second (open) state.

Yet another aspect of the invention includes a method for terminating at least one unused port of a switching circuit, including the steps of:

STEP 1: providing a switching circuit including:
  a. a common terminal;
  b. at least one signal path, wherein at least one such signal path includes:
    i. a path switch connected in series with the common terminal and the signal path, for selectively coupling the signal path to the common terminal;

ii. at least one shunt switch connected between the signal path and circuit ground, for selectively coupling the signal path to circuit ground; and iii. an absorptive switch module coupled in series with the path switch and a port, the absorptive switch module including a switch and a resistor coupled in parallel, wherein the switch has the characteristics of a resistor in a first state and of a capacitor in a second state;

STEP 2: selectively isolating a signal path from the common terminal by:

a. selecting a state for the path switch that decouples the signal path from the common terminal;

b. selecting a state for each shunt switch that couples the signal path to circuit ground; and c. selecting a state for the absorptive switch module in which the switch is set to a state that causes the absorptive switch module to behave as a parallel resistor-capacitor network.

As should be readily apparent to one of ordinary skill in the art, various embodiments of the invention can be implemented to meet a wide variety of specifications. Thus, selection of suitable component values are a matter of design choice (so long as the frequencies of interest mentioned above can be handled). The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A switching circuit including:
   (a) a common terminal;
   (b) one or more signal paths, wherein at least one signal path includes:
     (1) a path switch connected in series with the common terminal and the signal path, for selectively coupling the signal path to the common terminal;
     (2) at least one shunt switch connected between the signal path and circuit ground, for selectively coupling the signal path to the circuit ground;
     (3) an absorptive switch module coupled in series with the path switch and a port, the absorptive switch module including a switch and a resistor coupled in parallel;
       wherein the switch of the absorptive switch module has the characteristics of a resistor in a first state and of a capacitor in a second state, such that the absorptive switch module behaves as a resistor-capacitor network when the switch is in the second state, and the at least one shunt switch has the characteristics of an inductor-resistor network in a shunt switch first state and
       wherein the resistor-capacitor network behavior of the absorptive switch module functions as a negative inductance that substantially offsets a positive inductive reactance behavior of the inductor-resistor network characteristics of the at least one shunt switch for signal frequencies within the range of about 1 to about 40 GHz.

2. An RF signal switching circuit, including:
   (a) a common terminal;
   (b) one or more signal paths for conducting RF signals, wherein at least one signal path includes:
     (1) a path switch connected in series with the common terminal and the signal path, for selectively coupling the signal path to the common terminal;
     (2) at least one shunt switch connected between the signal path and circuit ground, for selectively coupling the signal path to the circuit ground, wherein the at least one shunt switch has the characteristics of increasing imaginary inductive impedance and increasing real resistive impedance with increasing frequency;
     (3) an absorptive switch module coupled in series with the path switch and a port, the absorptive switch module including a switch and a resistor coupled in parallel, wherein the absorptive switch module has the characteristics of a negative imaginary impedance with increasing magnitude with increasing frequency and a decreasing real impedance with increasing frequency;
       wherein the negative imaginary impedance with increasing magnitude and the decreasing real impedance of the absorptive switch module respectively substantially offset the increasing imaginary inductive impedance and increasing real resistive impedance of the at least one shunt switch for signal frequencies within the range of about 1 to about 40 GHz.

3. An RF signal switching circuit embodied in an integrated circuit, including:
   (a) a common terminal;
   (b) one or more signal paths for conducting RF signals, wherein at least one signal path includes:
     (1) a path switch connected in series with the common terminal and the signal path, for selectively coupling the signal path to the common terminal;
     (2) at least one shunt switch connected between the signal path and circuit ground, for selectively coupling the signal path to the circuit ground, wherein the at least one shunt switch has the characteristics of increasing inductive impedance and increasing real resistive impedance with increasing frequency;
     (3) an absorptive switch module coupled in series with the path switch and a port, the absorptive switch module including a FET switch and a resistor coupled in parallel, wherein the absorptive switch module has the characteristics of a negative imaginary impedance with increasing magnitude with increasing frequency and a decreasing real impedance with increasing frequency;
       wherein the negative imaginary impedance with increasing magnitude and the decreasing real impedance of the absorptive switch module respectively substantially offset the increasing inductive impedance and increasing real resistive impedance of the at least one shunt switch for signal frequencies within the range of about 1 to about 40 GHz.

4. An RF signal switching circuit embodied in an integrated circuit, including:
(a) a common terminal;
(b) one or more signal paths for conducting RF signals, wherein at least one signal path includes:
(1) a path switch connected in series with the common terminal and the signal path, for selectively coupling the signal path to the common terminal;
(2) at least one shunt switch connected between the signal path and circuit ground, for selectively coupling the signal path to the circuit ground, wherein the at least one shunt switch has the characteristics of an inductor-resistor network in a shunt switch first state;
(3) an absorptive switch module coupled in series with the path switch and a port, the absorptive switch module including a FET switch and a resistor coupled in parallel, wherein the switch of the absorptive switch module has the characteristics of a resistor in a first state and of a capacitor in a second state, such that the absorptive switch module behaves as a resistor-capacitor network when the FET switch is in the second state;
wherein the resistor-capacitor network behavior of the absorptive switch module functions as a negative imaginary impedance that substantially offsets a positive imaginary impedance behavior of the inductor-resistor network characteristics of the at least one shunt switch for signal frequencies within the range of about 1 to about 40 GHz.

5. An absorptive switch module, configured to be coupled in series between a port and a path switch of an RF switching circuit, the RF switching circuit further including at least one shunt switch having the characteristics of increasing inductive impedance and increasing real resistive impedance with increasing frequency, the absorptive switch module including a FET switch and a resistor coupled in parallel, wherein the absorptive switch module has the characteristics of a negative imaginary impedance with increasing magnitude with increasing frequency and a decreasing real impedance with increasing frequency, and wherein the negative imaginary impedance with increasing magnitude and the decreasing real impedance of the absorptive switch module respectively substantially offset the increasing inductive impedance and increasing real resistive impedance of the at least one shunt switch for signal frequencies within the range of about 1 to about 40 GHz.

6. An absorptive switch module, configured to be coupled in series between a port and a path switch of an RF switching circuit, the RF switching circuit further including at least one shunt switch having the characteristics of an inductor-resistor network in a shunt switch first state, the absorptive switch module including a FET switch and a resistor coupled in parallel, wherein the absorptive switch module has the characteristics of a resistor in a first state and of a capacitor in a second state, such that the absorptive switch module behaves as a resistor-capacitor network when the FET switch is in the second state, and wherein the resistor-capacitor network behavior of the absorptive switch module functions as a negative imaginary impedance that substantially offsets a positive imaginary impedance behavior of the inductor-resistor network characteristics of the at least one shunt switch for signal frequencies within the range of about 1 to about 40 GHz.

7. A method for terminating one or more unused ports of an RF signal switching circuit embodied in an integrated circuit, including:
(a) providing a common terminal;
(b) providing one or more signal paths for conducting RF signals, wherein at least one signal path includes:
(1) a path switch connected in series with the common terminal and the signal path, for selectively coupling the signal path to the common terminal;
(2) at least one shunt switch connected between the signal path and circuit ground, for selectively coupling the signal path to the circuit ground, wherein the at least one shunt switch has the characteristics of increasing inductive impedance and increasing real resistive impedance with increasing frequency;
(3) an absorptive switch module coupled in series with the path switch and a port, the absorptive switch module including a FET switch and a resistor coupled in parallel, wherein the absorptive switch module has the characteristics of a negative imaginary impedance with increasing magnitude with increasing frequency and a decreasing real impedance with increasing frequency;
wherein the negative imaginary impedance with increasing magnitude and the decreasing real impedance of the absorptive switch module respectively substantially offset the increasing inductive impedance and increasing real resistive impedance of the at least one shunt switch for signal frequencies within the range of about 1 to about 40 GHz.

8. A method for terminating one or more unused ports of an RF signal switching circuit embodied in an integrated circuit, including:
(a) providing a common terminal;
(b) providing one or more signal paths for conducting RF signals, wherein at least one signal path includes:
(1) a path switch connected in series with the common terminal and the signal path, for selectively coupling the signal path to the common terminal;
(2) at least one shunt switch connected between the signal path and circuit ground, for selectively coupling the signal path to the circuit ground, wherein the at least one shunt switch has the characteristics of an inductor-resistor network in a shunt switch first state;
(3) an absorptive switch module coupled in series with the path switch and a port, the absorptive switch module including a FET switch and a resistor coupled in parallel, wherein the switch of the absorptive switch module has the characteristics of a resistor in a first state and of a capacitor in a second state, such that the absorptive switch module behaves as a resistor-capacitor network when the FET switch is in the second state;
wherein the resistor-capacitor network behavior of the absorptive switch module functions as a negative imaginary impedance that substantially offsets a positive imaginary impedance behavior of the inductor-resistor network characteristics of the at least one shunt switch for signal frequencies within the range of about 1 to about 40 GHz.

9. An RF signal switching circuit embodied in an integrated circuit, including:

(a) a common terminal means for communicating a signal to or from one or more signal paths;
(b) at least one path switch means, each connected in series with the common terminal and a corresponding signal path, for selectively coupling the corresponding signal path to the common terminal;
(c) a shunt switch means connected to an associated one of the at least one path switch means between the corresponding signal path of such path switch means and circuit ground, for selectively coupling the corresponding signal path to the circuit ground, wherein the shunt switch means has the characteristics of increasing imaginary inductive impedance and increasing real resistive impedance with increasing frequency;
(d) an absorptive switch means coupled in series between a port and at least one path switch means having a connected shunt switch means, the absorptive switch means including a resistor coupled in parallel with a FET switch, for providing a negative imaginary impedance with increasing magnitude with increasing frequency and a decreasing real impedance with increasing frequency;
wherein the negative imaginary impedance with increasing magnitude and the decreasing real impedance of the absorptive switch module respectively substantially offset the increasing inductive impedance and increasing real resistive impedance of the associated at least one shunt switch for RF signal frequencies within the range of about 1 to about 40 GHz.

10. An RF signal switching circuit embodied in an integrated circuit, including:

(a) a common terminal means for communicating a signal to or from one or more signal paths;
(b) at least one path switch means, each connected in series with the common terminal and a corresponding signal path, for selectively coupling the corresponding signal path to the common terminal;
(c) a shunt switch means connected to an associated one of the at least one path switch means between the corresponding signal path of such path switch means and circuit ground, for selectively coupling the corresponding signal path to the circuit ground and having the characteristics of an inductor-resistor network in a shunt switch means first state;
(d) an absorptive switch means coupled in series between a port and at least one path switch means having a connected shunt switch means, the absorptive switch means including a resistor coupled in parallel with a FET switch, wherein the FET switch of the absorptive switch means has the characteristics of a resistor in a first state and of a capacitor in a second state, for behaving as a resistor-capacitor network when the FET switch is in the second state;
wherein the resistor-capacitor network behavior of the absorptive switch means functions as a negative imaginary impedance that substantially offsets a positive imaginary impedance behavior of the inductor-resistor network characteristics of the associated at least one shunt switch for RF signal frequencies within the range of about 1 to about 40 GHz.

* * * * *